United States Patent
Imoto et al.

(10) Patent No.: US 8,936,965 B2
(45) Date of Patent: Jan. 20, 2015

(54) SEMICONDUCTOR DEVICE AND MANUFACTURING METHOD THEREOF

(75) Inventors: Yuki Imoto, Atsugi (JP); Yuji Asano, Atsugi (JP); Tetsunori Maruyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 299 days.

(21) Appl. No.: 13/295,469

(22) Filed: Nov. 14, 2011

(65) Prior Publication Data
US 2012/0132902 A1 May 31, 2012

(30) Foreign Application Priority Data

Nov. 26, 2010 (JP) ................................. 2010-263472

(51) Int. Cl.
*H01L 51/40* (2006.01)
*H01L 29/786* (2006.01)
(Continued)

(52) U.S. Cl.
CPC ..... *H01L 29/7869* (2013.01); *H01L 21/823456* (2013.01); *H01L 29/4966* (2013.01);
(Continued)

(58) Field of Classification Search
CPC ............ H01L 29/4908; H01L 29/7869; H01L 51/0541; H01L 21/823456; H01L 21/82345; H01L 51/0554; H01L 51/0562; H01L 29/4232; H01L 29/42376; H01L 29/42392; H01L 29/4958; H01L 29/4966; H01L 29/78645
USPC ....................... 438/104, 157, 164, 99; 257/43, 257/E29.473, E21.411, E51.006, E29.128, 257/E29.135, E29.137
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

(Continued)

*Primary Examiner* — Joseph C Nicely
(74) *Attorney, Agent, or Firm* — Eric J. Robinson; Robinson Intellectual Property Law Office, P.C.

(57) ABSTRACT

A normally-off transistor having an oxide semiconductor layer in a channel formation layer is provided. The transistor comprises: a first oxide semiconductor layer functioning as a channel formation region; a source electrode layer and a drain electrode layer which overlap with the first oxide semiconductor layer; a gate insulating layer which is provided over and in contact with the first oxide semiconductor layer, the source electrode layer, and the drain electrode layer; a second oxide semiconductor layer which is provided over and in contact with the gate insulating layer and overlaps with the first oxide semiconductor layer; and a gate electrode layer provided over the second oxide semiconductor layer. A manufacturing method thereof is also disclosed.

14 Claims, 9 Drawing Sheets

(51) Int. Cl.
*H01L 29/49* (2006.01)
*H01L 51/05* (2006.01)
*H01L 29/423* (2006.01)
*H01L 29/66* (2006.01)
*H01L 21/8234* (2006.01)

(52) U.S. Cl.
CPC ...... *H01L51/0554* (2013.01); *H01L 29/42392* (2013.01); *H01L 29/4908* (2013.01); *H01L 29/66742* (2013.01)
USPC .................. 438/99; 257/43; 257/E29.137

(56) References Cited

U.S. PATENT DOCUMENTS

| | | | |
|---|---|---|---|
| 6,060,338 A * | 5/2000 | Tanaka et al. | 438/99 |
| 6,294,274 B1 | 9/2001 | Kawazoe et al. | |
| 6,562,700 B1 * | 5/2003 | Gu et al. | 438/477 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,564,055 B2 * | 7/2009 | Hoffman | 257/43 |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,994,500 B2 | 8/2011 | Kim et al. | |
| 8,058,645 B2 | 11/2011 | Jeong et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,232,552 B2 * | 7/2012 | Yano et al. | 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0098487 A1 * | 5/2003 | Ngo et al. | 257/382 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0248521 A1 * | 11/2005 | Kimura et al. | 345/96 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0286737 A1 * | 12/2006 | Levy et al. | 438/199 |
| 2006/0292777 A1 | 12/2006 | Dunbar | |
| 2007/0023750 A1 * | 2/2007 | Chiang et al. | 257/43 |
| 2007/0024187 A1 | 2/2007 | Shin et al. | |
| 2007/0034915 A1 * | 2/2007 | Hoffman | 257/291 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187674 A1 * | 8/2007 | Nakamura et al. | 257/40 |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0299702 A1 * | 12/2008 | Son et al. | 438/104 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0256467 A1 * | 10/2009 | Yamazaki et al. | 313/504 |
| 2009/0278120 A1 * | 11/2009 | Lee et al. | 257/43 |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0097838 A1 * | 4/2010 | Tanaka et al. | 365/112 |
| 2010/0109002 A1 | 5/2010 | Itagaki et al. | |
| 2010/0144089 A1 * | 6/2010 | Kaji et al. | 438/104 |
| 2010/0193790 A1 * | 8/2010 | Yeo et al. | 257/59 |
| 2010/0224878 A1 * | 9/2010 | Kimura | 257/57 |
| 2010/0294349 A1 * | 11/2010 | Srinivasan et al. | 136/255 |
| 2010/0320458 A1 | 12/2010 | Umeda et al. | |
| 2010/0320459 A1 * | 12/2010 | Umeda et al. | 257/43 |
| 2011/0001131 A1 * | 1/2011 | Lee et al. | 257/40 |
| 2011/0019113 A1 * | 1/2011 | Saitoh et al. | 349/33 |
| 2011/0084269 A1 * | 4/2011 | Yamazaki et al. | 257/43 |
| 2011/0108834 A1 * | 5/2011 | Yamazaki et al. | 257/43 |
| 2011/0115763 A1 | 5/2011 | Yamazaki et al. | |
| 2011/0140114 A1 * | 6/2011 | Ko et al. | 257/59 |
| 2011/0168993 A1 * | 7/2011 | Jeon et al. | 257/43 |
| 2011/0193083 A1 | 8/2011 | Kim et al. | |
| 2011/0215328 A1 | 9/2011 | Morosawa et al. | |
| 2011/0240992 A1 * | 10/2011 | Yamazaki | 257/43 |
| 2011/0253970 A1 * | 10/2011 | Marks et al. | 257/9 |
| 2011/0263079 A1 * | 10/2011 | Wang | 438/149 |
| 2011/0309353 A1 * | 12/2011 | Kaneko et al. | 257/43 |
| 2012/0037962 A1 * | 2/2012 | Breyta et al. | 257/288 |
| 2012/0074413 A1 * | 3/2012 | Kim | 257/59 |
| 2012/0080753 A1 * | 4/2012 | Singh et al. | 257/347 |
| 2012/0104406 A1 * | 5/2012 | Inoue et al. | 257/72 |

(56) References Cited

U.S. PATENT DOCUMENTS

| | | | |
|---|---|---|---|
| 2012/0119205 A1 | 5/2012 | Taniguchi et al. | |
| 2012/0132911 A1* | 5/2012 | Shimada et al. | 257/43 |
| 2012/0227810 A1* | 9/2012 | Hieslmair | 136/261 |
| 2012/0262056 A1* | 10/2012 | Bright | 313/498 |
| 2013/0062602 A1* | 3/2013 | Jeon et al. | 257/43 |
| 2013/0244366 A1* | 9/2013 | Sargent et al. | 438/63 |

FOREIGN PATENT DOCUMENTS

| | | | | |
|---|---|---|---|---|
| JP | 60-198861 A | 10/1985 | | |
| JP | 63-210022 A | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 05-251705 A | 9/1993 | | |
| JP | 08-264794 A | 10/1996 | | |
| JP | 11-505377 | 5/1999 | | |
| JP | 2000-044236 A | 2/2000 | | |
| JP | 2000-150900 A | 5/2000 | | |
| JP | 2002-076356 A | 3/2002 | | |
| JP | 2002-289859 A | 10/2002 | | |
| JP | 2003-086000 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2007-096055 A | 4/2007 | | |
| JP | 2007-123861 A | 5/2007 | | |
| JP | 2007-220818 A | * 8/2007 | | H01L 29/786 |
| JP | 2009-231613 | 10/2009 | | |
| JP | 2010-016347 | 1/2010 | | |
| JP | 4415062 | 2/2010 | | |
| JP | 2010-056539 A | 3/2010 | | |
| JP | 2010-067954 | 3/2010 | | |
| JP | 2010-177431 | 8/2010 | | |
| JP | 4571221 | 10/2010 | | |
| JP | 2012-160679 | 8/2012 | | |
| KR | 2004037889 A | * 5/2004 | | |
| WO | WO-2004/114391 | 12/2004 | | |
| WO | WO-2008/133345 | 11/2008 | | |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda. T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In, Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO2 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

(56) References Cited

OTHER PUBLICATIONS

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE AND MANUFACTURING METHOD THEREOF

BACKGROUND OF THE INVENTION

1. Field of the Invention

An embodiment of the disclosed invention relates to a semiconductor device including a transistor or including a circuit having such a transistor. For example, an embodiment of the present invention relates to a semiconductor device including a transistor in which a channel formation region is formed using an oxide semiconductor or including a circuit having such a transistor.

2. Description of the Related Art

A technique for manufacturing a transistor or the like by using an oxide semiconductor film for a channel formation region and applying it to a display device has been attracting attention. Examples of such a transistor include a transistor in which zinc oxide (ZnO) is used as an oxide semiconductor film and a transistor in which $InGaO_3(ZnO)_m$ is used as an oxide semiconductor film. A technique for manufacturing such a transistor including an oxide semiconductor film over a light-transmitting substrate and applying it to a switching element or the like of an image display device is disclosed in Patent Documents 1 and 2.

An inverted staggered (bottom-gate) transistor in which an oxide semiconductor film containing indium (In), gallium (Ga), and zinc (Zn) is used as a semiconductor layer and a buffer layer using a metal oxide are provided between the semiconductor layer and source and drain electrode layers is disclosed in Patent Document 3. In this transistor, an ohmic contact is formed by intentionally providing the metal oxide layer as the buffer layer between the semiconductor layer and the source and drain electrode layers.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2010-056539

SUMMARY OF THE INVENTION

There are various modes for display devices; in the field of liquid crystal display devices, a blue-phase liquid crystal has been attracting attention. In addition, in display devices called electronic paper, a medium which can electrically control the contrast (also called electronic ink or the like) is used. Further, self-luminous display devices using electroluminescent materials have been put to practical use. For such new display modes, a transistor used in a display device is required to have a higher withstand voltage.

Further, it is preferable that a channel be formed at a positive threshold voltage which is as close to 0 V as possible in a transistor used in a display device. If the threshold voltage of the transistor is negative, the transistor is a so-called normally-on transistor, in which current flows between the source electrode and the drain electrode even when the gate voltage is 0 V. As for an active-matrix display device, electric characteristics of a transistor included in a circuit are significant and performance of the display device depends on the electric characteristics. The control of a normally-on transistor in which a channel is formed and a drain current flows even at a negative voltage is difficult, and the transistor is not suitable as a transistor used in a circuit.

However, even a normally-on transistor can be used in a display device as long as it is a transistor in which a channel is formed at a threshold voltage which is as close to 0V as possible.

In view of the above, it is an object of an embodiment of the disclosed invention to provide a semiconductor device having a novel structure and a method for manufacturing the semiconductor device.

It is an object of an embodiment of the disclosed invention to provide a semiconductor device including a normally-off transistor and including a circuit having such a transistor.

An embodiment of the disclosed invention relates to a semiconductor device including a first oxide semiconductor layer functioning as a channel formation region, a source electrode layer and a drain electrode layer which overlap with the first oxide semiconductor layer, a gate insulating layer which is in contact with the first oxide semiconductor layer, the source electrode layer, and the drain electrode layer, a second oxide semiconductor layer which is in contact with the gate insulating layer and overlaps with the first oxide semiconductor layer, and a gate electrode layer provided over the second oxide semiconductor layer.

Further, an embodiment of the disclosed invention relates to a method for manufacturing a semiconductor device comprising the steps of forming a first oxide semiconductor layer over an insulating surface, forming a source electrode layer and a drain electrode layer which overlap with the first oxide semiconductor layer, forming a gate insulating layer which is in contact with the first oxide semiconductor layer, the source electrode layer, and the drain electrode layer, forming a second oxide semiconductor layer which is in contact with the gate insulating layer and overlaps with the first oxide semiconductor layer, forming a gate electrode layer over the second oxide semiconductor layer.

As the second oxide semiconductor layer provided between the gate electrode layer and the gate insulating layer, specifically, an In—Ga—Zn—O film, an In—Sn—O film, an In—Ga—O film, an In—Zn—O film, an Sn—O film, or an In—O film is used. These films each have a work function of greater than or equal to 4 eV and less than 5 eV. Thus, when such a film is provided between the gate electrode layer and gate insulating layer, the threshold voltage, which is an electric characteristic of the transistor, can be made to be positive, so that a so-called normally-off transistor can be obtained.

Note that in this specification, a transistor which can be regarded as having no drain current flowing therein when a gate electrode is 0 V and a source-drain voltage is at least 1 V is defined as a normally-off transistor. In contrast, a transistor which can be regarded as having a drain current flowing therein when a gate voltage is 0 V and a source-drain voltage is at least 1 V is defined as a normally-on transistor.

More specifically, in this specification, an n-channel transistor having a positive gate voltage at a drain current of $1 \times 10^{-12}$ A is defined as a normally-off transistor. In addition, an n-channel transistor having a negative gate voltage at a drain current of $1 \times 10^{-12}$ A is defined as a normally-on transistor As the first oxide semiconductor layer functioning as a channel formation region, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, or an In—Ga—O film can be used. Further, $SiO_2$ may be contained in the above oxide semiconductor layer. Here, an In—Ga—Zn—O film means an oxide film including indium (In), gallium (Ga), and zinc (Zn).

Note that the ordinal numbers such as "first" and "second" in this specification are used for convenience and do not denote the order of steps and the stacking order of layers. In addition, the ordinal numbers in this specification do not denote particular names which specify the present invention.

Note that a semiconductor device in this specification refers to all electrical devices which can function by utilizing semiconductor characteristics, and electro-optical devices, semiconductor circuits, and electronic appliances are all semiconductor devices.

According to an embodiment of the disclosed invention, a semiconductor device including a normally-off transistor or including a circuit having such a transistor can be obtained.

DETAILED DESCRIPTION OF THE INVENTION

Figure 1A:
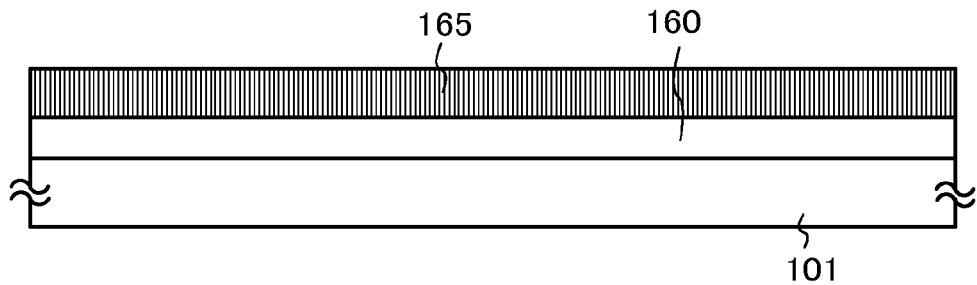
FIGS. 1A to 1C are cross-sectional views illustrating manufacturing steps of a transistor.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

A transistor of this embodiment and a manufacturing method thereof will be described with reference to FIGS. 1A to 1C, FIGS. 2A and 2B, FIGS. 8A and 8B, and FIGS. 9A and 9B.

First, in order to remove moisture and the like attached to a substrate 101, the substrate 101 is subjected to vacuum heat treatment. In this embodiment, the substrate 101 is heated at 400° C. for 10 minutes in a chamber with a pressure of $10^{-5}$ Pa.

The substrate 101 may be subjected to reverse sputtering instead of being subjected to the vacuum heat treatment. The reverse sputtering refers to a method in which an RF power source is used for application of voltage to a substrate in an argon atmosphere and plasma is generated around the substrate to modify a surface. Note that instead of an argon atmosphere, a nitrogen atmosphere, a helium atmosphere, an oxygen atmosphere, or the like may be used. The substrate 101 may be subjected to reverse sputtering, whereby moisture and the like attached to the substrate 101 can be removed.

As a material of the substrate 101, a glass material such as aluminosilicate glass, aluminoborosilicate glass, or barium borosilicate glass can be used. In the mass production, a mother glass with the following size is preferably used for the substrate 101: the 8-th generation (2160 mm×2460 mm); the 9-th generation (2400 mm×2800 mm, or 2450 mm×3050 mm); the 10-th generation (2950 mm×3400 mm); or the like. High process temperature and a long period of process time drastically shrink the mother glass. Thus, in the case where mass production is performed with use of the mother glass, the preferable heating temperature in the manufacturing process is lower than or equal to 600° C., further preferably, lower than or equal to 450° C.

Instead of the above glass substrate, a substrate formed of an insulator such as a ceramic substrate, a quartz substrate, or a sapphire substrate may be used as the substrate 101. Alternatively, crystallized glass or the like may be used. Further alternatively, a substrate obtained by forming an insulating layer over a surface of a semiconductor substrate such as a silicon wafer or a surface of a conductive substrate formed of a metal material can be used.

Next, an oxide insulating film 160 which serves as a base insulating layer is formed over a substrate 101.

The oxide insulating film 160 is formed using an oxide insulating film from which part of oxygen is released by heat treatment. An oxide insulating film which contains oxygen exceeding the stoichiometric proportion is preferably used as the oxide insulating film from which part of oxygen is released by heat treatment. The oxide insulating film from which part of contained oxygen is released by heat treatment can diffuse oxygen into an oxide semiconductor film, formed later, by heat treatment. Typical examples of the oxide insulating film 160 are films of a silicon oxide, a silicon oxynitride, a silicon nitride oxide, an aluminum oxide, an aluminum oxynitride, a gallium oxide, a hafnium oxide, an yttrium oxide, and the like.

The thickness of the oxide insulating film 160 is greater than or equal to 50 nm, preferably greater than or equal to 200 nm and less than or equal to 500 nm. With the thick oxide insulating film 160, the amount of oxygen released from the oxide insulating film 160 can be increased, and defects at the interface between the oxide insulating film 160 and the oxide semiconductor film formed later can be reduced.

The oxide insulating film 160 is formed by a sputtering method, a CVD method, or the like. Preferably, the oxide insulating film from which part of contained oxygen is released by heat treatment is easily formed by a sputtering method. In this embodiment, a silicon oxide is formed to have a thickness of 300 nm by a sputtering method as the oxide insulating film 160.

Then, an oxide semiconductor film 165 is formed over the oxide insulating film 160 (see FIG. 1A).

The oxide semiconductor film 165 is formed with a thickness of greater than or equal to 5 nm and less than or equal to 50 μm by a sputtering method or the like with the use of a metal oxide target containing at least zinc under an atmosphere of only oxygen or a mix of oxygen and an inert gas such as argon. As a typical example of the metal oxide target, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide or a Sn—Zn—O-based metal oxide can be used.

When the purity of the target is set to 99.99% or higher, alkali metal, hydrogen atoms, hydrogen molecules, water, a hydroxyl group, a hydride, or the like mixed to the oxide semiconductor film can be reduced. In addition, when such a target is used, the concentration of alkali metal such as lithium, sodium, or potassium can be reduced in the oxide semiconductor film.

In order to shift the threshold voltage of electric characteristics of a transistor in a positive direction, a slight amount of nitrogen may be mixed in the oxide semiconductor film 165 to decrease the Fermi level ($E_F$).

At the formation of the oxide semiconductor film 165, the pressure of a treatment chamber in a sputtering apparatus is set to 0.4 Pa or less, whereby mixing of an impurity such as alkali metal or hydrogen to an object or a surface of the object can be suppressed. Note that the hydrogen contained in the object may be represented by a hydrogen molecule, water, a hydroxyl group, or a hydride in addition to a hydrogen atom.

When the leakage rate of the treatment chamber of the sputtering apparatus is set to lower than or equal to $1 \times 10^{-10}$ Pa·m³/second, entry of impurities such as an alkali metal or a hydride into the oxide semiconductor in the formation by a sputtering method can be suppressed. Further, with the use of an entrapment vacuum pump as an evacuation system, counter flow of impurities such as an alkali metal, a hydrogen atom, a hydrogen molecule, water, hydroxyl group, or hydride from the evacuation system can be prevented.

In the formation of the oxide semiconductor film 165, the distance between the target and the substrate (T-S distance) is set to greater than or equal to 40 mm and less than or equal to 300 mm (preferably, greater than or equal to 60 mm).

After the oxide semiconductor film 165 is formed, if necessary, heat treatment may be performed in an atmosphere which contains less hydrogen and moisture (a nitrogen atmosphere, an oxygen atmosphere, a dry-air atmosphere (for example, a dew point is lower than or equal to −40° C., preferably lower than or equal to −60° C.), or the like) (at a temperature higher than or equal to 200° C. and lower than or equal to 450° C.). The heat treatment can be called dehydration or dehydrogenation, which is for eliminating H, OH, or the like from the oxide semiconductor film 165. In the case where the temperature is raised in an inert atmosphere and the atmosphere is switched to an atmosphere containing oxygen during the heat treatment, or in the case where an oxygen atmosphere is employed in the heat treatment, such heat treatment can also be called treatment for supplying oxygen.

Next, the oxide semiconductor film 165 is processed, so that an island-shaped oxide semiconductor layer 166 is formed.

The process of the oxide semiconductor layer can be performed as follows: a mask having a desired shape is formed using a first photomask over the oxide semiconductor film 165, and then the oxide semiconductor film 165 is etched. The mask may be formed by a method such as photolithography or an ink-jet method.

Note that either dry etching or wet etching may be performed for etching of the oxide semiconductor film 165. It is needless to say that both of them may be employed in combination.

Figure 1B:
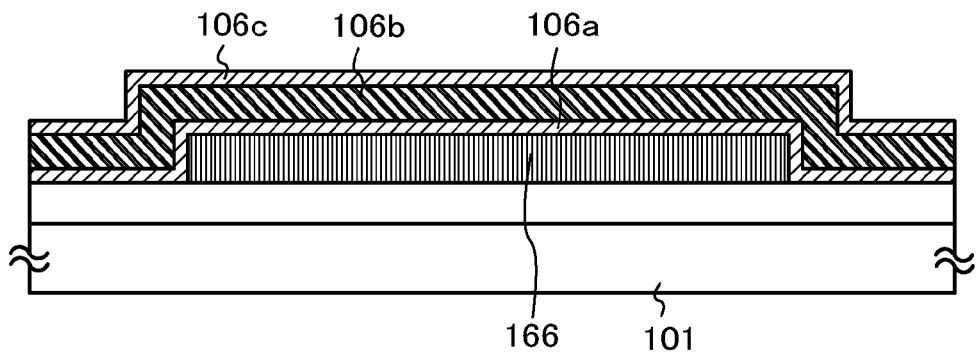

Next, a first conductive film 106a, a second conductive film 106b, and a third conductive film 106c are formed over the island-shaped oxide semiconductor layer 166 (see FIG. 1B). In this embodiment, a 50-nm-thick titanium film, a 100-nm-thick aluminum film, and a 5-nm-thick titanium film are formed as the first conductive film 106a, the second conductive film 106b, and the third conductive film 106c, respectively.

Figure 1C:
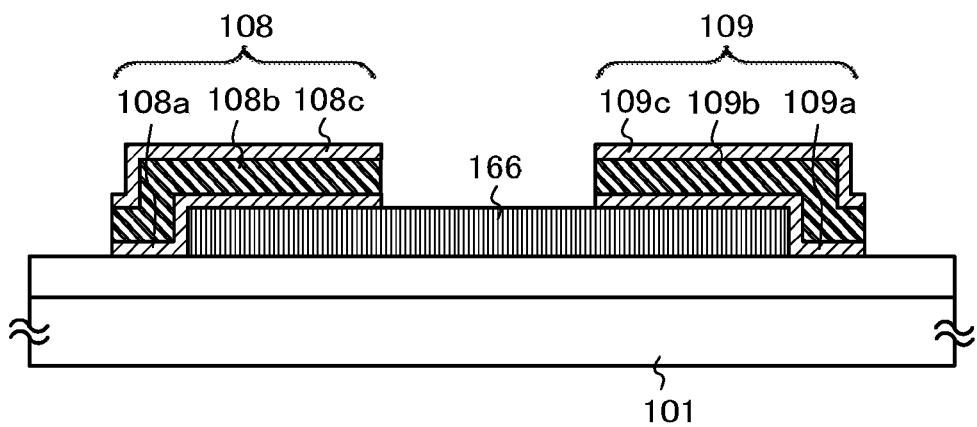

Next, a mask is formed using a second photomask over the third conductive film 106c, and then etching is performed selectively thereon, whereby a source electrode layer 108 (including a source electrode layer 108a, a source electrode layer 108b, and a source electrode layer 108c) and a drain electrode layer 109 (including a drain electrode layer 109a, a drain electrode layer 109b, and drain electrode layer 109c) are formed (see FIG. 1C). Note that three conductive layers are stacked for each of the source electrode layer 108 and the drain electrode layer 109 in this embodiment; however, the structure of this embodiment is not limited thereto. Each of the source electrode layer 108 and the drain electrode layer 109 may be formed using a single conductive film or a stacked layer containing two layers or four or more layers.

Note that a buffer layer may be formed using a metal oxide containing nitrogen between the island-shaped oxide semiconductor layer 166 and the drain electrode layer 109 (or the source electrode layer 108). By providing the buffer layer between the drain electrode layer 109 (or the source electrode layer 108) and the oxide semiconductor layer 166, concentration of an electric field is relieved and reliability of a transistor can be improved.

Then, a gate insulating layer 103 which covers side surfaces of the source electrode layers 108a to 108c and the drain electrode layers 109a to 109c and is in contact with the oxide semiconductor layer 166 is formed.

The gate insulating layer 103 can be formed to have a single-layer structure or a stacked structure using silicon oxide, silicon nitride, silicon oxynitride, silicon nitride oxide, gallium oxide, aluminum oxide, aluminum nitride, aluminum oxynitride, aluminum nitride oxide, hafnium oxide, or a combination thereof by a plasma CVD method, a sputtering method, or the like. Considering that the gate insulating layer 103 functions as a gate insulating layer of a transistor, a material having a high dielectric constant such as hafnium oxide, tantalum oxide, yttrium oxide, hafnium silicate ($HfSi_xO_y(x>0, y>0)$), hafnium aluminate ($HfAl_xO_y(x>0, y>0)$), hafnium silicate to which nitrogen is added, or hafnium aluminate to which nitrogen is added may be employed. A sputtering method is appropriate in terms of low possibility of entry of hydrogen, water, and the like.

It is preferable to use a Ga—Zn—O film or an $\alpha$-$Ga_2O_3$ film having a hexagonal crystal structure as the gate insulating layer 103 because the crystal of the oxide semiconductor layer 166 can conform with the crystal of the gate insulating layer 103 continuously.

Figure 2A:
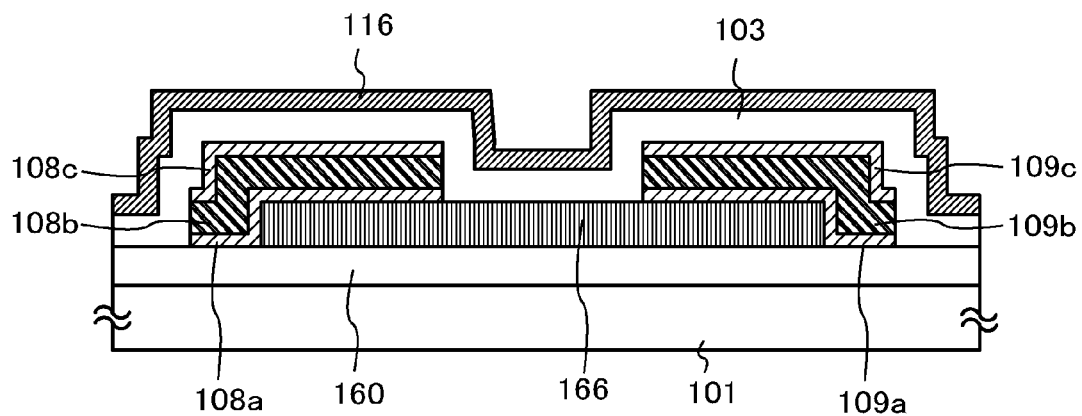
FIGS. 2A and 2B are cross-sectional views illustrating manufacturing steps of a transistor.

Next, an oxide semiconductor film 116 is formed on the gate insulating layer 103 (see FIG. 2A).

An In—Ga—Zn—O film, an In—Sn—O film, an In—Ga—O film, an In—Zn—O film, a Sn—O film, an In—O film, or the like is used as the oxide semiconductor film 116 which is formed on and in contact with the gate insulating layer 103.

Table 1 shows the band gaps and the work functions of an In—Ga—Zn—O film, an In—Sn—O film, an In—Ga—O film, an In—Zn—O film, a Sn—O film, and an In—O film which can be used as the oxide semiconductor film 116. As shown in Table 1, the band gaps of these materials are greater than or equal to 2.7 eV and less than or equal to 3.3 eV.

TABLE 1

| Oxide semiconductor | Band gap [eV] | Work function [eV] |
|---|---|---|
| In—Ga—Zn—O | 3.2 | 4.6 |
| In—Sn—O | 3.0 | 4.3 |
| In—Ga—O | 3.3 | 4.6 |

TABLE 1-continued

| Oxide semiconductor | Band gap [eV] | Work function [eV] |
|---|---|---|
| In—Zn—O | 2.7 | 4.5 |
| Sn—O | 3.3 | 4.8 |
| In—O | 3.0 | 4.3 |

As described above, an In—Ga—Zn—O film, an In—Sn—O film, an In—Ga—O film, an In—Zn—O film, a Sn—O film, or an In—O film is used as the oxide semiconductor film 116. Each film as the oxide semiconductor film 116 has a work function of greater than or equal to 4 eV and less than 5 eV (see Table 1). Therefore, a normally-off transistor can be obtained. This is a point different from a transistor using silicon. The threshold value of an n-channel transistor using silicon is shifted to be positive by using an element which imparts p-type conductivity for a gate electrode or by doping silicon with a slight amount of an impurity element which imparts p-type conductivity. On the other hand, as shown in this embodiment, the threshold voltage can be shifted to be positive by manufacturing a transistor so that an oxide semiconductor film is used for a semiconductor layer, a gate insulating layer is interposed between an oxide semiconductor layer and the oxide semiconductor film having a work function of greater than or equal to 4 eV and less than 5 eV, and the oxide semiconductor film is in contact with a gate electrode.

In this embodiment, the oxide semiconductor film 116 is formed to a thickness of 20 nm in an argon and oxygen atmosphere under the following conditions: a target for an oxide semiconductor (an In—Ga—Zn—O-based oxide semiconductor including $In_2O_3$, $Ga_2O_3$, and ZnO at 1:1:2 [molar ratio] manufactured by Mitsui Mining & Smelting Co., Ltd.) is used; the distance between the substrate and the target (also called a T-S distance) is greater than or equal to 40 mm and less than or equal to 300 mm, specifically, 60 mm; the substrate temperature is grater than or equal to 80° C. and less than 450° C., specifically, 200° C.; the pressure is 0.4 Pa to 0.6 Pa, specifically, 0.4 Pa; and the direct current (DC) power is 0.1 kW to 5 kW, specifically, 0.5 kW.

The resistance of an In—Ga—Zn—O film is decreased by heat treatment; thus heat treatment may be performed if necessary to reduce the resistance. An In—Ga—Zn—O film is polycrystalline including a c-axis orientation, and the crystallinity thereof is high. The work function of an In—Ga—Zn—O film which was deposited as a single film by a sputtering method was 4.6 eV according to the measurement as shown in Table 1.

Figure 2B:
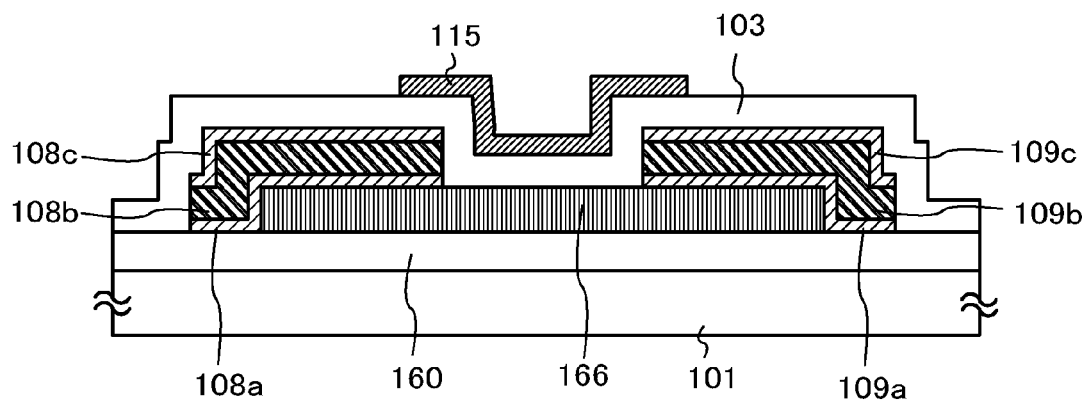

Next, the oxide semiconductor film 116 is processed, so that an oxide semiconductor layer 115 is obtained (see FIG. 2B).

Figure 8A:
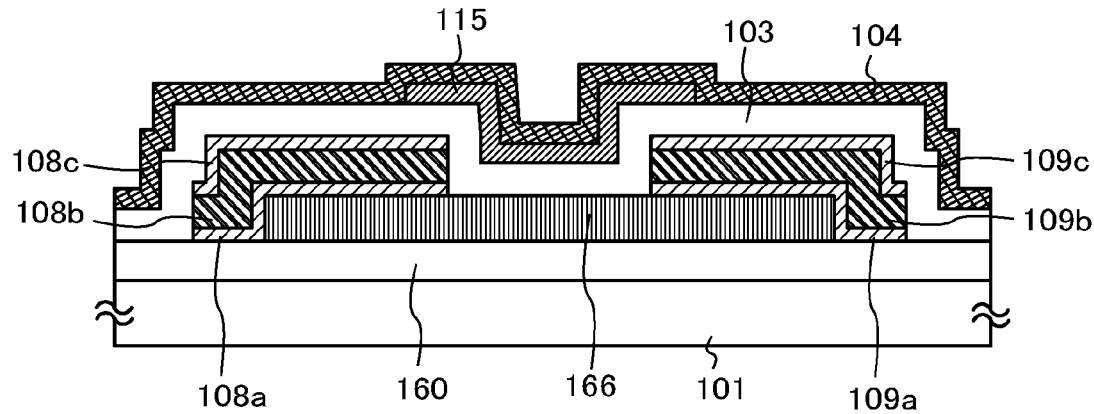
FIGS. 8A and 8B are cross-sectional views illustrating manufacturing steps of a transistor.

A conductive film 104 is formed to cover the gate insulating layer 103 and the oxide semiconductor layer 115 (see FIG. 8A).

The conductive film 104 can be formed using a metal such as molybdenum, titanium, tantalum, tungsten, aluminum, copper, neodymium, or scandium, nitride of any of these metals, or an alloy which contains any of these metals as its main component.

It is preferable that the conductive film 104 be a stacked layer using aluminum, copper, or the like in at least one layer. In the case where copper is used for one layer of the conductive film 104, the process temperature after the formation of the gate electrode layer is set to be lower than or equal to 450° C.

In the case where aluminum is used for one layer of the conductive film 104, the process temperature after the formation of the conductive film 104 is set to be higher than or equal to 250° C. and lower than or equal to 380° C., preferably higher than or equal to 300° C. and lower than or equal to 350° C. Further, in the case where aluminum is used as a material of the conductive film 104 and an interlayer insulating film containing an oxide is further formed thereover, an oxide (e.g., alumina) might be formed on the surface of the aluminum, which is in contact with the interlayer insulating film containing the oxide. Therefore, tantalum nitride or titanium nitride may be used for a barrier layer over the conductive film 104 in such a case.

Figure 8B:
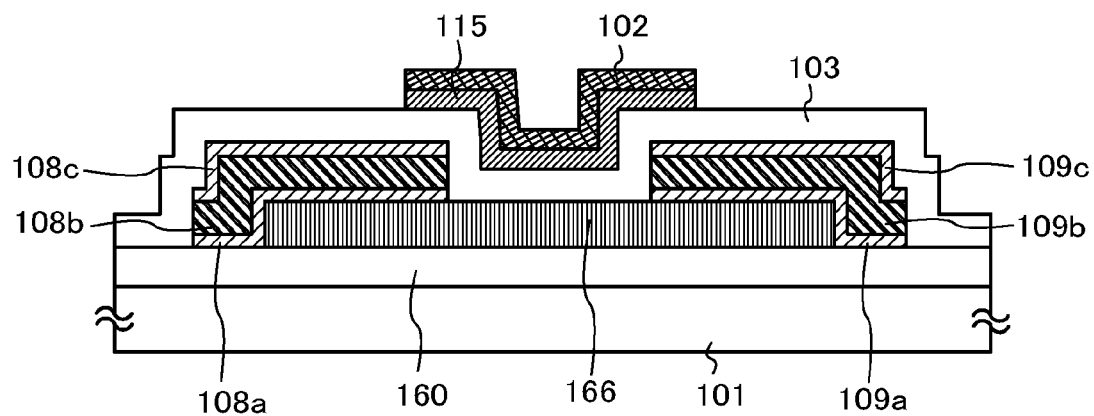

Next, the conductive film 104 is processed, so that a gate electrode layer 102 in contact with the oxide semiconductor layer 115 is formed (see FIG. 8B).

Through the above steps, a top-gate transistor is formed. The top-gate transistor illustrated in FIG. 8B has a structure in which the source electrode layer 108 and the drain electrode layer 109 are on and in contact with the oxide semiconductor layer 166 functioning as a channel formation region.

Figure 9A:
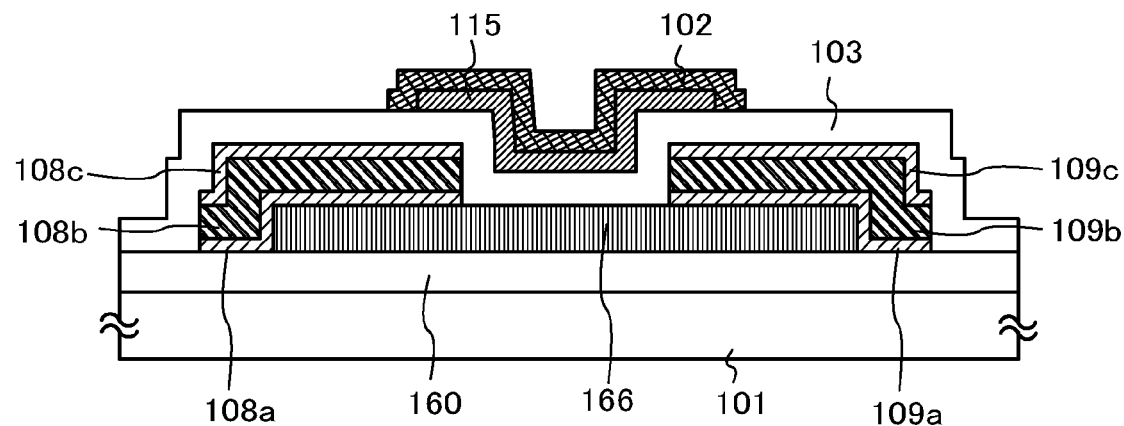
FIGS. 9A and 9B are cross-sectional views illustrating manufacturing steps of a transistor.
Figure 9B:
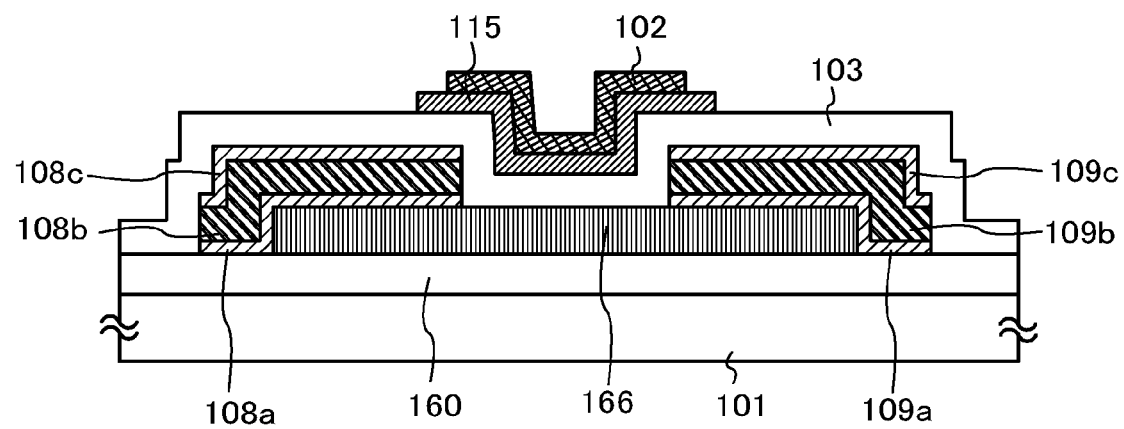

The end portions of the oxide semiconductor layer 115 are aligned with the end portions of the gate electrode layer 102 in FIG. 8B (i.e., side surfaces thereof are coplanar with each other); however, the structure of this embodiment is not limited thereto. The end portions of the gate electrode layer 102 may be positioned outside the end portions of the oxide semiconductor layer 115 as illustrated in FIG. 9A. Alternatively, the end portions of the gate electrode layer 102 may be positioned inside the end portions of the oxide semiconductor layer 115 as illustrated in FIG. 9B.

In this embodiment, after the oxide semiconductor film 116 is processed to provide the oxide semiconductor layer 115, the conductive film 104 is formed, and then the conductive film 104 is processed to form the gate electrode layer 102. However, the structure of this embodiment is not limited thereto. The oxide semiconductor film 116 and the conductive film 104 may be formed successively and processed using the same mask so as to form the oxide semiconductor layer 115 and the gate electrode layer 102. In that case, the end portion of the oxide semiconductor layer 115 is aligned with the end portion of the gate electrode layer 102.

According to this embodiment, a normally-off transistor can be obtained.

Even in the case where the transistor of this embodiment is a normally-on transistor, a channel can be formed at a threshold voltage which is very close to 0V because the oxide semiconductor layer 115 is formed.

Further, since the oxide semiconductor layer 115 is formed between the gate electrode layer 102 and the oxide semiconductor layer 166 functioning as a channel formation region, the thickness of the gate insulating layer 103 can be thin.

Example

In this example, characteristics of the transistor described in Embodiment will be described.

FIG. 8B shows a structure of the transistor of this example. A 300-nm-thick silicon oxide film was formed as the oxide insulating film 160 serving as the base insulating layer; a 20-nm-thick In—Ga—Zn—O film was formed as the oxide semiconductor layer 166 serving as the first oxide semiconductor layer, a 50-nm-thick tungsten film was formed as the source electrode layer 108 and the drain electrode layer 109; a 30-nm-thick silicon oxide film containing nitrogen was formed as the gate insulating layer 103; a 10-nm-thick In—Ga—Zn—O film was formed as the oxide semiconductor layer 115 serving as the second oxide semiconductor layer; and a 140-nm-thick tungsten film was formed as the gate electrode layer 102.

Note that the oxide semiconductor film 116 which is to be the oxide semiconductor layer 115 was formed under the following conditions: a target for an oxide semiconductor (an In—Ga—Zn—O-based oxide semiconductor including $In_2O_3$, $Ga_2O_3$, and ZnO at 1:1:2 [molar ratio] manufactured by Mitsui Mining & Smelting Co., Ltd.) was used; the distance between the substrate and the target (also called a T-S distance) was 60 mm; the substrate temperature was 200° C.; the pressure was 0.4 Pa; the direct current (DC) power was 0.5 kW; and the flow rate of argon was 40 sccm.

In a transistor of a comparative example, a 15-nm-thick tantalum nitride film that is a conductive film was formed instead of the oxide semiconductor layer 115 serving as the second oxide semiconductor layer.

Figure 6:
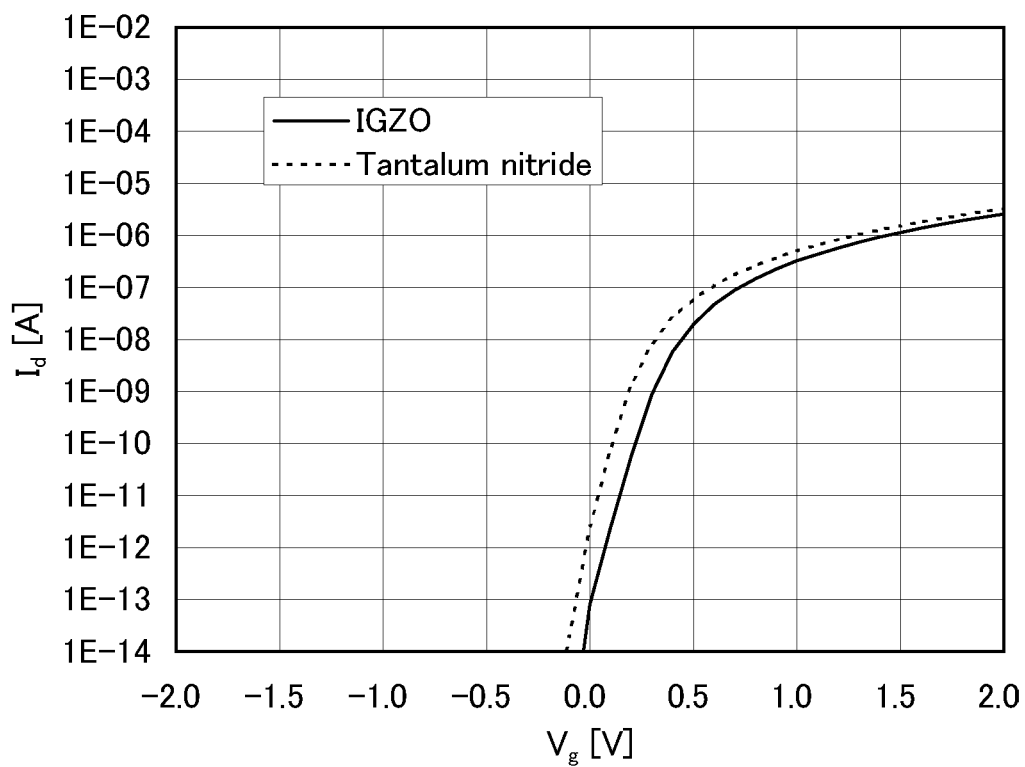
FIG. 6 is a graph illustrating characteristics of transistors.

FIG. 6 is a graph illustrating the relation between a gate voltage ($V_g$) and a drain current ($I_d$) of the transistor (with a channel length of 2.9 μm and a channel width of 10 μm) of this example and the transistor of the comparative example. Note that in FIG. 6, characteristics of the transistor of this example are represented by a solid line (a line denoted by IGZO), and characteristics of the transistor of the comparative example are represented by a dotted line (a line denoted by tantalum nitride).

As shown in FIG. 6, the gate voltage when the drain current is $1\times10^{-12}$ A is positive in the transistor of this example. Thus, it can be said that the transistor of this example is a normally-off transistor. On the other hand, the gate voltage when the drain current is $1\times10^{-12}$ A is negative in the transistor of the comparative example. Thus, it can be said that the transistor of the comparative example is a normally-on transistor.

Figure 7:
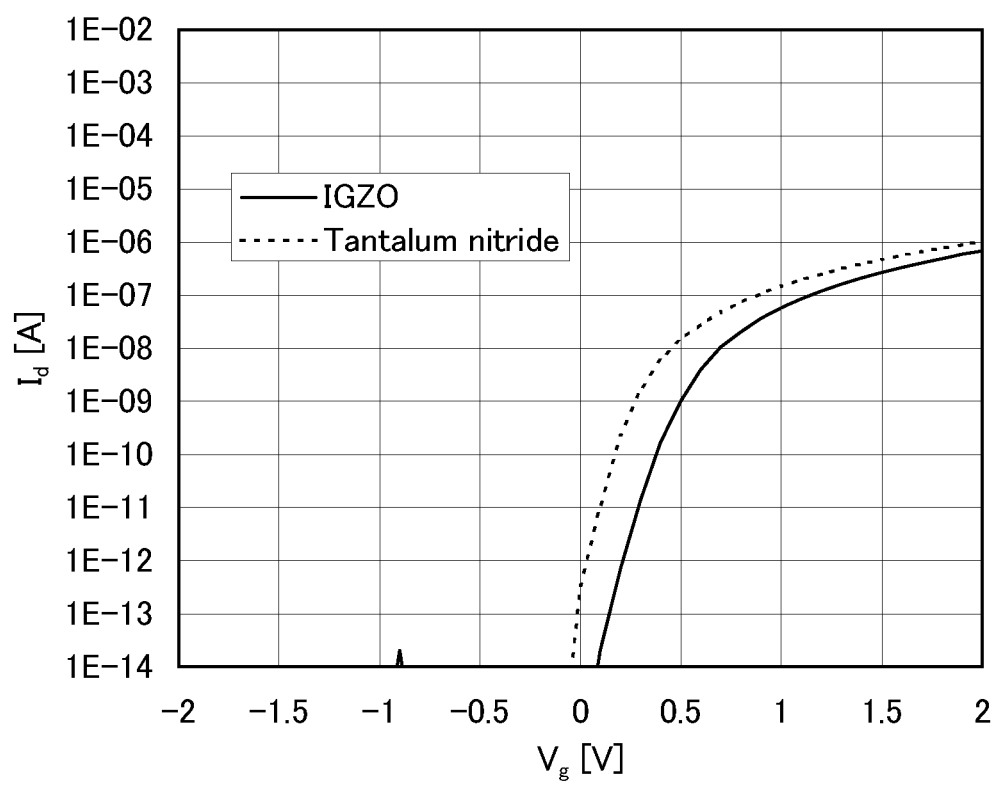
FIG. 7 is a graph illustrating characteristics of transistors.

FIG. 7 is a graph illustrating the relation between a gate voltage ($V_g$) and a drain current ($I_d$) of the transistor (with a channel length of 9.9 μm and a channel width of 10 μm) of this example and the transistor of the comparative example. The transistor of this example used in FIG. 7 has the same structure as the transistor of this example used in FIG. 6 except for the channel length.

As shown in FIG. 7, in the transistor of this example, the drain current when the gate voltage is 0V is less than or equal to the lower limit of measurement ($1\times10^{-14}$ A). The current value of less than or equal to the lower limit of measurement ($1\times10^{-14}$ A) is sufficiently small such that it can be considered that no current flows. Thus, it can be said that the transistor of this example used in FIG. 7 is a normally-off transistor.

Figure 3:
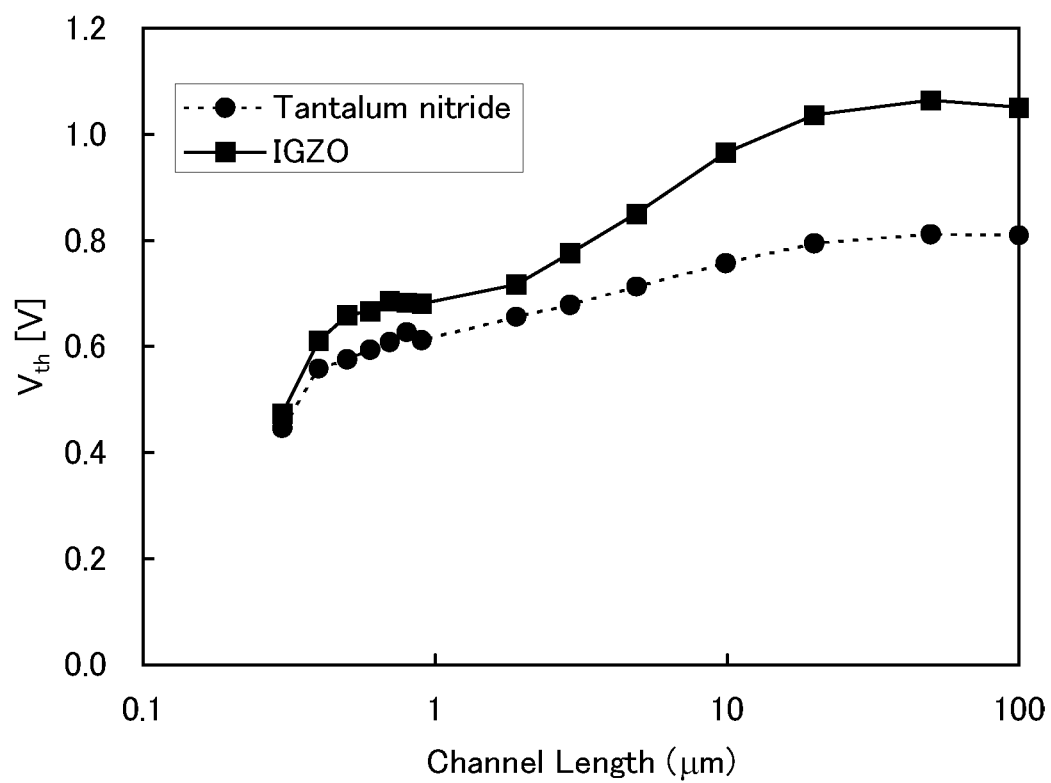
FIG. 3 is a graph illustrating characteristics of transistors.
Figure 4:
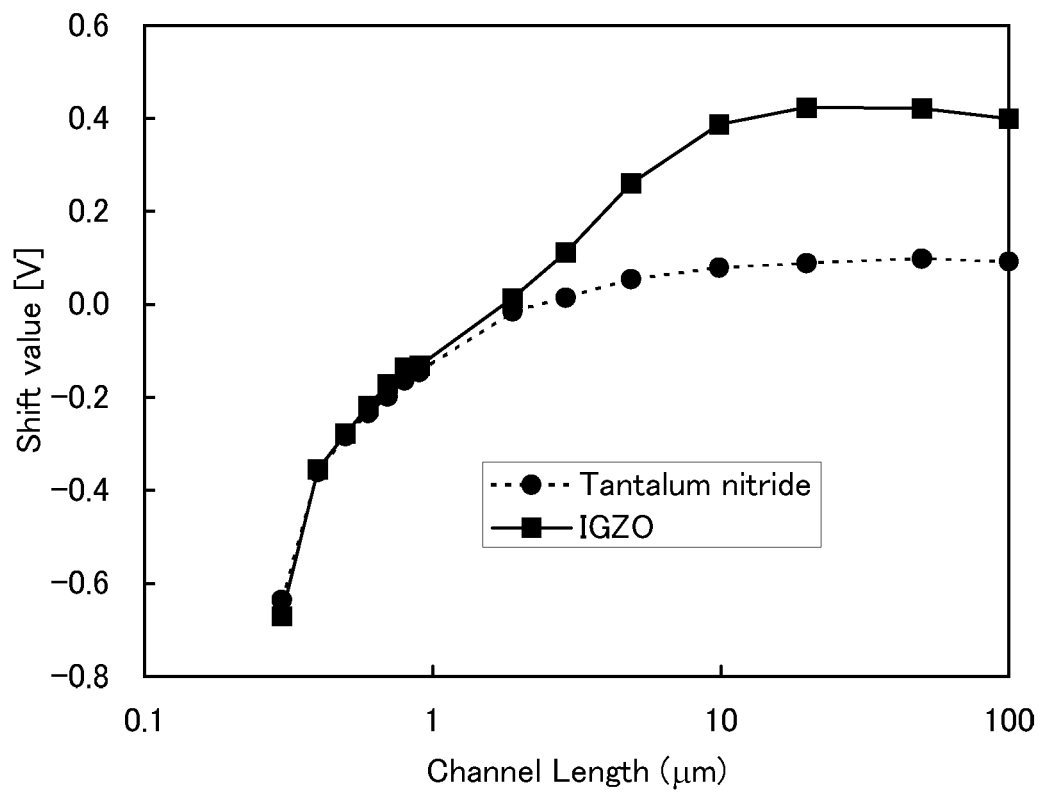
FIG. 4 is a graph illustrating characteristics of transistors.
Figure 5:
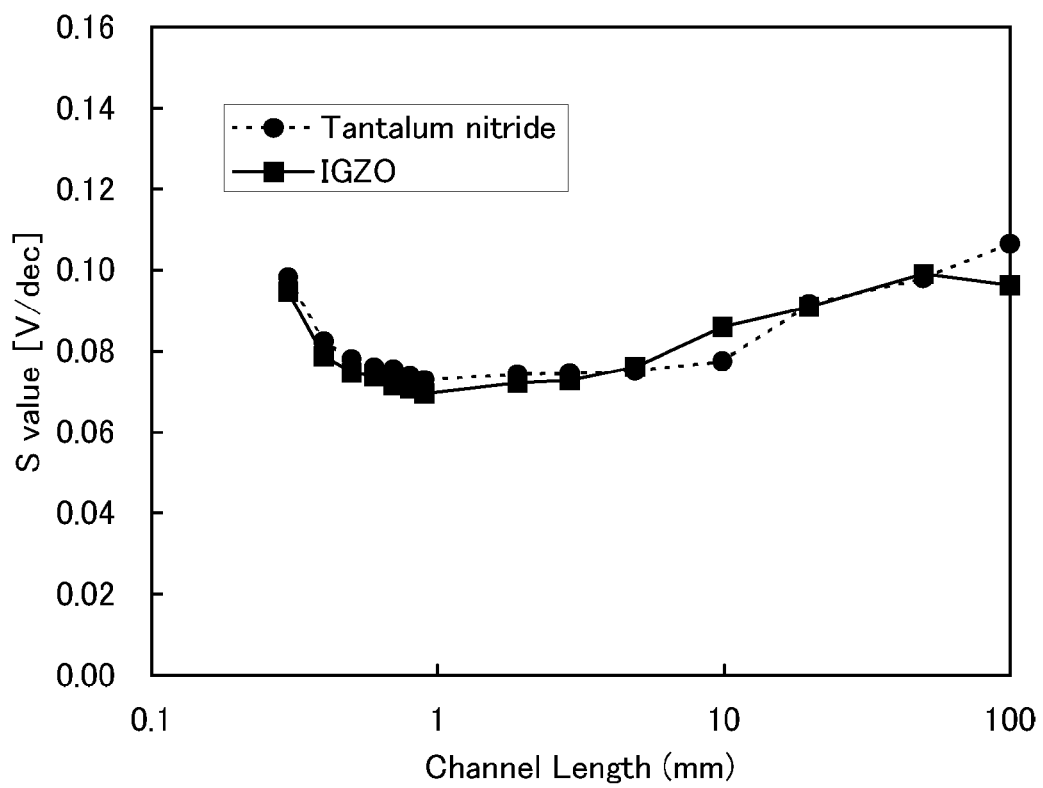
FIG. 5 is a graph illustrating characteristics of transistors.

FIG. 3, FIG. 4, and FIG. 5 show the relation between a channel length and a threshold voltage ($V_{th}$), the relation between a channel length and a shift value, and the relation between a channel length and a S value, respectively, of the transistor of this example and the transistor of the comparative example. Also in FIG. 3, FIG. 4, and FIG. 5, the transistor of this example is represented by a solid line (a line denoted by IGZO), and the transistor of the comparative example is represented by a dotted line (a line denoted by tantalum nitride).

As shown in FIG. 3, FIG. 4, and FIG. 5, particularly in FIG. 3, the threshold voltage of the transistor of this example is higher than the threshold voltage of the transistor of the comparative example. As the threshold voltage is higher, the transistor is more likely to be a normally-off transistor. Thus, it can be said that the transistor of this example is more likely to be a normally-off transistor than the transistor of the comparative example.

This example shows that a normally-off transistor can be obtained according to an embodiment of the disclosed invention.

This application is based on Japanese Patent Application serial no. 2010-263472 filed with Japan Patent Office on Nov. 26, 2010, the entire contents of which are hereby incorporated by reference.

What is claimed is:

1. A semiconductor device comprising:
    a first oxide semiconductor layer over a substrate;
    a source electrode layer and a drain electrode layer over the first oxide semiconductor layer;
    a gate insulating layer over and in contact with the first oxide semiconductor layer, the source electrode layer, and the drain electrode layer;
    a second oxide semiconductor layer over and in contact with the gate insulating layer, the second oxide semiconductor layer comprising gallium and indium; and
    a gate electrode layer over and in contact with the second oxide semiconductor layer, the gate electrode layer comprising a metal selected from molybdenum, titanium, tantalum, tungsten, aluminum, and copper,
    wherein the gate electrode layer covers the second oxide semiconductor layer so that a side surface of the second oxide semiconductor layer is in direct contact with the gate electrode layer.

2. The semiconductor device according to claim 1, wherein a work function of the second oxide semiconductor layer is greater than or equal to 4 eV and less than 5 eV.

3. The semiconductor device according to claim 1, further comprising an oxide insulating film between the substrate and the first oxide semiconductor layer.

4. The semiconductor device according to claim 3, wherein the oxide insulating film includes oxygen which exceeds a stoichiometric proportion.

5. The semiconductor device according to claim 1, wherein the gate electrode layer comprises aluminum.

6. The semiconductor device according to claim 1, wherein the second oxide semiconductor layer is an In—Ga—Zn—O film.

7. The semiconductor device according to claim 1, wherein the gate insulating layer comprises gallium.

8. A method for manufacturing a semiconductor device comprising the steps of:
    forming a first oxide semiconductor layer over a substrate;
    forming a source electrode layer and a drain electrode layer over and in contact with the first oxide semiconductor layer;
    forming a gate insulating layer over and in contact with the first oxide semiconductor layer, the source electrode layer, and the drain electrode layer;
    forming a second oxide semiconductor layer over and in contact with the gate insulating layer, the second oxide semiconductor layer comprising gallium and indium; and
    forming a gate electrode layer over and in contact with the second oxide semiconductor layer, the gate electrode layer comprising a metal selected from molybdenum, titanium, tantalum, tungsten, aluminum, and copper,
    wherein the gate electrode layer covers the second oxide semiconductor layer so that a side surface of the second oxide semiconductor layer is in direct contact with the gate electrode layer.

9. The method according to claim 8, wherein a work function of the second oxide semiconductor layer is greater than or equal to 4 eV and less than 5 eV.

10. The method according to claim 8, further comprising a step of forming an oxide insulating film between the substrate and the first oxide semiconductor layer.

11. The method according to claim 10, wherein the oxide insulating film includes oxygen which exceeds a stoichiometric proportion.

12. The method according to claim 8, wherein the gate electrode layer comprises aluminum.

13. The method according to claim 8, wherein the second oxide semiconductor layer is an In—Ga—Zn—O film.

14. The method according to claim 8, wherein the gate insulating layer comprises gallium.

* * * * *